United States Patent [19]

Sakurai

[11] Patent Number: 4,613,305
[45] Date of Patent: Sep. 23, 1986

[54] HORIZONTAL FURNACE WITH A SUSPENSION CANTILEVER LOADING SYSTEM

[75] Inventor: Junji Sakurai, Tokyo, Japan

[73] Assignee: Fujitsu Limited, Kawasaki, Japan

[21] Appl. No.: 732,304

[22] Filed: May 9, 1985

[30] Foreign Application Priority Data

May 15, 1984 [JP] Japan .................................. 59-96983

[51] Int. Cl.$^4$ .............................................. F27D 5/00
[52] U.S. Cl. ........................................ 432/253; 432/5; 432/6; 414/152
[58] Field of Search ...................... 432/5, 6, 152, 253; 414/152, 156

[56] References Cited

U.S. PATENT DOCUMENTS

| | | | |
|---|---|---|---|
| 2,656,170 | 10/1953 | Mann | 432/5 |
| 2,754,104 | 7/1956 | Hess | 432/5 |
| 3,669,431 | 6/1972 | Lenss et al. | 432/5 |
| 3,723,053 | 3/1973 | Myers et al. | 432/6 |
| 4,217,095 | 8/1980 | Tokitsu | 432/6 |
| 4,439,146 | 3/1984 | Sugita | 432/253 |
| 4,461,617 | 7/1984 | Liu | 432/253 |

FOREIGN PATENT DOCUMENTS 2524616 12/1976 Fed. Rep. of Germany.
2848691 5/1979 Fed. Rep. of Germany.
1160162 7/1969 United Kingdom.

OTHER PUBLICATIONS

RCA Review, vol. 44, Jun. 1983, Olsen et al., "Double-Barrel III-V Compound Vapor-Phase Epitaxy Systems", pp. 270-286.
Journal of Vacuum Science & Technology, vol. 14, No. 5, Sep./Oct. 1977, New York; Kern et al., "Advances in Deposition Processes for Passivation Films", pp. 1082-1099.

Primary Examiner—Henry C. Yuen
Attorney, Agent, or Firm—Staas & Halsey

[57] ABSTRACT

A horizontal furnace for processing semiconductor devices having a suspension cantilever which supports workpieces in the furnace tube to achieve particle or dust-free operation while still allowing the loading and unloading of workpieces to be heat-treated. The furnace tube consists of a heating chamber, a connecting chamber and a supporting chamber vertically connected to each other. The chambers correspond to an accommodating portion, a connecting portion and a supporting portion of the cantilever. The supporting chamber is kept at lower temperature than that of the heating chamber during heat processing to prevent deformation or creeping of the suspension cantilever.

6 Claims, 8 Drawing Figures

HORIZONTAL FURNACE WITH A SUSPENSION CANTILEVER LOADING SYSTEM

BACKGROUND OF THE INVENTION

The present invention relates to a horizontal furnace for processing semiconductor devices such as a semiconductor integrated circuit (IC). More particularly, it relates to a high temperature horizontal furnace having a suspension cantilever which supports workpieces, such as wafers, in a furnace tube during all stages of the process including loading, unloading and processing of the wafers.

Processes used in the fabrication of semiconductor devices such ICs include a lot of physical and chemical processes such as a diffusion process for the formation of doped diffusion regions in the wafers, an oxidation process for forming oxide layers on the wafers, a chemical vapor deposition (CVD) process for formation of epitaxial layers, etc., wherein high temperature heat treatments are employed. The heat treatment temperature often exceeds 1000° C. While the furnace type currently most commonly used in a mass-production line for ICs is a horizontal furnace, vertical type furnaces also may be used. In order to improve the productivity and reliability of the heat treatments, large heat-treatment capacity, uniform temperature distribution and dust-free cleanliness of the horizontal furnace are required.

Generally, a dust-free system is essential for the production of semiconductor devices. With respect to horizontal furnaces, there has been a problem in connection with dust mainly comprised of particles generated by friction between the quartz boats and the quartz furnace tube during loading and unloading of the wafers. The particles are comprised mainly of quartz, being derived from the wear generated by the quartz-to-quartz friction between quartzwares, boats and furnace tubes, etc. In addition, residual particle materials are deposited on the inner walls of the quartz tube during heat treatments of CVD processes, for example, which cause additional dust particles in the furnace.

FIG. 1 is a cross-sectional view of a prior art horizontal furnace, illustrating its structure and the loading of wafers to be heat-treated. Wafers A are stacked in a plurality of quartz baskets B and accommodated on a quartz boat C. The wafers A are loaded into the furnace by pushing the boat C into the tube 1 in the direction of the arrow a, using a quartz bar 4 having a hooking notch at its end. Similarly, the wafers A are unloaded by pulling the quartz boat C out of the tube 1 with the bar 4. The inlet of the furnace tube 1 is covered by a quartz cap 2. Furnace gas such as nitrogen is introduced through a gas inlet pipe 1a and flows through the tube 1 and out through an outlet pipe 1b.

The furnace tube 1 has heaters 3, shown in dot-dash lines in FIG. 1, disposed outside the tube wall, and is surrounded by a layer of heat insulation material (not shown) such as alumina. A temperature equalizing tube (not shown) of high thermal conductivity ceramic material is arranged outside the tube 1 to obtain a uniform axial temperature distribution. With the horizontal furnace of this type, the generation of particles is inevitable during the loading and unloading of the wafers as described above. In addition, sticking between the quartz tube 1 and quartz boat C tends to occur in a treatment at high temperatures such as approximately 1100° C.

In order to eliminate the generation of particles as described above, a suspension cantilever loading system has been used, wherein wafers stacked in baskets B are sustained inside the furnace tube 1 during all the stages of the heating process including loading, unloading and heat processing. With this system, the wafers A, baskets B and the suspending means never touch the inner wall of the furnace tube 1, thus eliminating the generation of particles. FIG. 2 is a cross-sectional view illustrating a prior art horizontal furnace having a suspension cantilever loading system extending along the longitudinal axis of the furnace tube 1. For loading or unloading wafers from the horizontal furnace, a suspension cantilever means 14 carrying baskets B stacked with the wafers is forwarded into or pulled out from the center of the furnace tube 1 by a cantilever drive mechanism 15. The upper portion of the cantilever 14 has a boat-like shape suitable for accommodating the baskets B. A cap 12 of the furnace tube 1 has a special opening 12a allowing the passage of the supporting portion of the cantilever.

FIG. 3 is a perspective view of a prior art suspension cantilever system. By automatically controlling the operation of the cantilever driver 15, the loading and unloading of the wafers A can be performed according to a predetermined schedule to reduce any undesirable thermal shock to the wafers, which might cause damage to them. Although loading and unloading without contacting the inner wall of the tube 1 can be accomplished by this cantilever suspension system, a problem of deformation of the cantilever 14 arises during high temperature heat treatment. In order to minimize the deformation of the suspension cantilever 14, supports of heat-resistive material such as pure alumina ($Al_2O_3$) or high-grade silicon carbide are used. The supports are sheathed with pure fused quartz in order to be easily cleaned. However, the strength of these materials is limited at high temperatures.

To overcome the problem of the high temperature deformation, a "soft-landing," i.e., descending vertically without any shock, of the baskets B onto the inner wall of the tube 1 during the heat processing can be carried out by controlling the cantilever driver 15. After the soft-landing of the baskets B, the cantilever 14 is retracted from the furnace tube 1 so as not to be exposed to heating. However, this requires a more complicated mechanism of the driver 15, and contact between the baskets B and the inner wall of the furnace tube 1 still generates particles.

SUMMARY OF THE INVENTION

It is an object of the present invention to provide a horizontal furnace for semiconductor fabrication processes, which is capable of dust-free or particle-free operation during loading, unloading and heat processing of wafers or other workpieces.

It is another object of the present invention to provide a horizontal furnace having a cantilever suspension system for loading and unloading of wafers or other workpieces which utilizes a specially designed cantilever to prevent the suspension cantilever from deformation during high temperature heat treatment and which permits loading, heating and unloading of the workpieces without any contact with the inner walls of the furnace tube.

To eliminate the above-mentioned drawbacks of a conventional cantilever suspension system, an improved suspension cantilever has been designed. The new cantilever comprises a boat-like portion to accommodate the wafers which are exposed to a high temperature, and a rigid supporting rod for supporting the boat-like portion which is positioned in a different space having relatively lower temperature, resulting in maintaining a high rigidity of the supporting rod during the heat treating process. The boat-like portion is supported by the rigid supporting rod through stays connecting the boat-like portion and the supporting rod. The whole cantilever is made of quartz. The new suspension cantilever may be driven forwardly and backwardly by a conventional drive mechanism following a predetermined schedule. The horizontal furnace has a furnace tube having a cross-sectional profile which allows the passage of the new suspension cantilev,er structure. The furnace of the present invention comprises a main heating chamber for heating the wafers and the boat-like portion, heaters mounted outside the heating chamber and a supporting chamber for the supporting rod which is kept at a relatively lower temperature, suitable to maintain the strength of the material of the supportng rod, and a connecting chamber connecting the heating chamber and the supporting chamber along the full length in the axial direction of both chambers, so as to accommodate the stays of the cantilever. Normally, the heating chamber, the connecting chamber and the supporting chamber are positioned vertically downwardly in the recited order.

The features and advantages of the present invention will become apparent from the detailed description of the invention with reference to the accompanying drawings.

DESCRIPTION OF THE PREFERRED EMBODIMENTS

Figure 4:
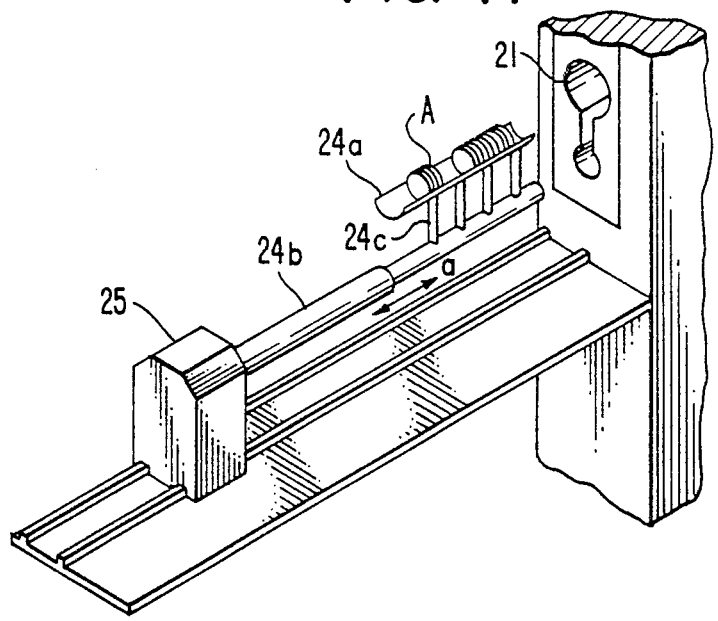
FIG. 4 is a perspective view of an embodiment of the present invention having an improved suspension cantilever.

A horizontal furnace according to the present invention utilizing a new type suspension cantilever 24 as shown in FIG. 4. The cantilever 24 comprises an accommodating portion 24a, a supporting portion 24b and connecting portion 24c. The whole cantilever preferably is constructed of quartz. Other suitable materials, however, such as alumina or silicon nitride also may be used to construct the supporting portion 24b to provide the cantilever with higher strength. The accommodating portion 24a has a boat-like shape, being in the form of a rectangular tray having straight generatix in the longitudinal direction and having a generally circular arc cross-section in the perpendicular direction, suitable to accommodate baskets B. The supporting portion 24b is comprised of a rigid supporting rod supported by a suspension cantilever driver mechanism 25. The accommodating portion 24a and the supporting rod 24b are connected to each other by connecting portion 24c, preferably formed by a plurality of stays as shown in FIG. 4. The center planes of the three portions 24a, 24b and 24c are essentially in the same vertical plane.

Figure 5A:
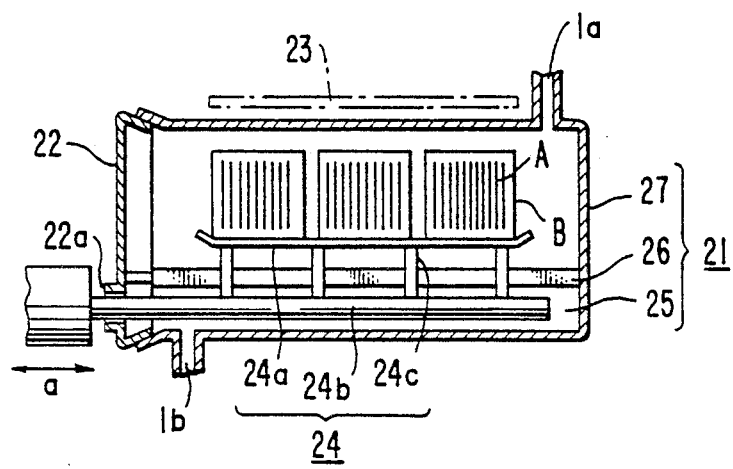
FIG. 5(a) is a cross-sectional view of an embodiment of the present invention, along the axis of the furnace tube.
Figure 5B:
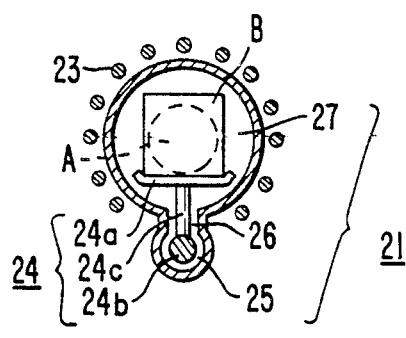
FIG. 5(b) is a cross-sectional view of the furnace of FIG. 5(a) perpendicular to the furnace axis.

In accordance with the newly designed suspension cantilever 24 described above, a horizontal furnace having a cross-sectional profile permitting the passage of the above suspension cantilever is part of the present invention. FIG. 5(a) is a cross-sectional view along the axis of a horizontal furnace of a preferred embodiment of the present invention utilizing the above new-type suspension cantilever, and FIG. 5(b) is a cross-sectional view perpendicular to the axis of the horizontal furance of FIG. 5(a). The furnace tube 21 of the horizontal furnace comprises a heating chamber 27 and a supporting chamber 25 arranged in parallel to each other. The heating chamber 27 is located above the supporting chamber 25. Both chambers are connected by a connecting chamber 26 along the full axial length of the chambers. The heating chamber 27 is heated by conventional heaters 23, whose elements are arranged longitudinally on the outside portion of the heating chamber 27. The supporting chamber 25 has a relatively small diameter but is of sufficient size to allow the supporting rod 24b to move in an axial direction without contacting the inner wall of the chamber 25. The supporting chamber 25 has no heating means and therefore stays at a lower temperature than the temperature of the heating chamber 27 during operation. The cross-sectional profile of the connecting chamber 26 is generally rectangular to allow for the passage of the stays 24c of the suspension cantilever 24. The overall profile of the cross-section of the tube of the horizontal furnace is shown in FIG. 5(b). The strength of the suspension cantilever 24 is remarkably increased because of the lower temperatures in the supporting chamber which reuslts in a substantial reduction of any elastic deformation and non-detectable permanent deformation (creeping) of the cantilever after repeated operation at high temperature in the heating chamber.

The following example demonstrates the effectiveness of the present invention. A cantilever constructed of quartz was loaded with six baskets, each stacked with 25 pieces of 6 inch wafers. A heat treatment was then performed at 1250° C. for 10 hours. The cantilever was suspended in the supporting chamber completely free from the inner wall thereof. The temperature of the supporting room was approximately 700° C. After repeating the above heat treatment 10 times, no permanent deformation of the cantilever was observed. Morever, no contact between the cantilever and the furnace tube wall was observed. The elastic deformation measured at the end of the cantilever, before and after the experiment, remained approximately the same. Furthermore, after the heat treatments, the residual particles on the wafers were carefully checked by a laser scanning surface dust counter, and satisfactory results were obtained.

In the above loading experments using an improved suspension cantilever, wafers were loaded as the load weight, but it will be obvious to those skilled in the art that loads other than wafers may be used.

The cross-sectional profile of the furnace tube is not confined to that shown in FIG. 5(b), but may be replaced by any profile permitting the passage of the cantilever without any contact between the cantilever and the furnace tube wall, and which reudces the heat transfer from the heating chamber to the supporting chamber by radiation and convection of the furnace gas so that the temperature of the supporting chamber can be kept as low as possible. In addition, the relative arrangement of the heating chamber and the supporting chamber is not confined to the vertical arrangement as disclosed above and shown in FIGS. 5(a) and 5(b). Other relative positioning of both chambers, such as a horizontal arrangement, maybe used. The vertical arrangement, however, is the most suitable to maintan the supporting chamber at a low temperature, because no upward heat convection by the flow of furnace gas occurs, and no bending moment around the longitudinal axis is applied to the connecting portion of the cantilever.

Figure 1:
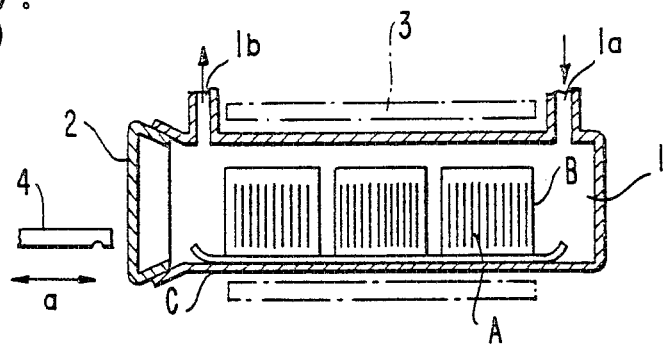
FIG. 1 is a cross-sectional view of a prior art horizontal furnace along the axis of the furnace tube, illustrating the structure of the furnace tube and a quartz boat loaded with wafers.
Figure 2:
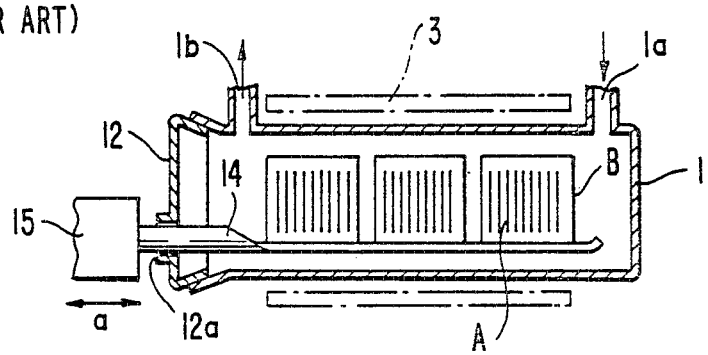
FIG. 2 is a cross-sectional view of another prior art horizontal furnace along the axis of the furnace tube, illustrating the structure of the furnace tube and a conventional suspension cantilever loaded with wafers.
Figure 3:
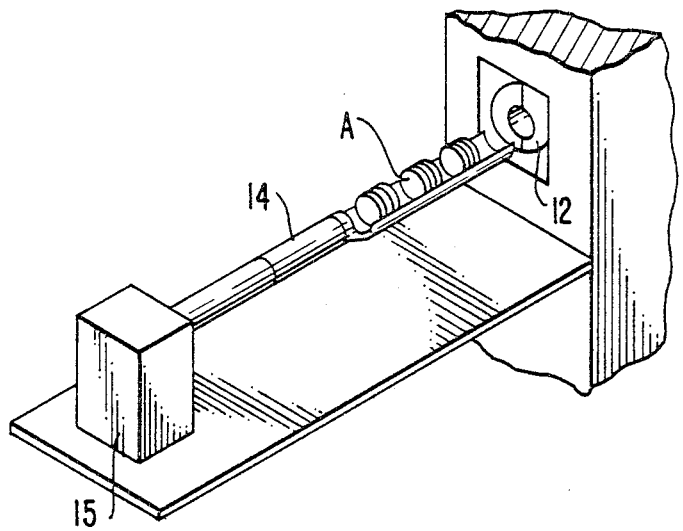
FIG. 3 is a perspective view of a prior art suspension cantilever for a horizontal furnace.
Figure 6:
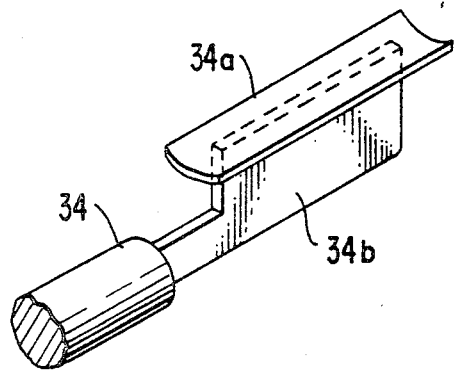
FIG. 6 is a perspective view of another embodiment of the present invention having a modified suspension cantilever with a combined supporting and connecting portion.
Figure 7:
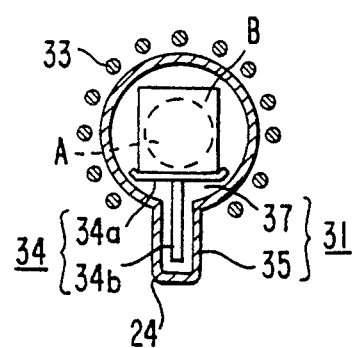
FIG. 7 is a cross-sectional view of a furnace of the present invention utilizing the suspension cantilever of FIG. 6.

FIG. 6 is a perspective view of a suspension cantilever 34 which is a modification of the cantilever 24 of FIG. 4, wherein the supporting portion 24b and connecting portion 24c are replaced by a combined supporting plate 34b which supports an accommodating portion 34a. FIG. 7 is a cross-sectional view of a furnace tube utilizing the cantilever construction of FIG. 6. The suspension cantilever 34 is mounted in a furnace tube 32 having a heating chamber 37 and a combined supporting-connecting chamber 35 of approximately rectangular cross-section. The cross-section of the furnace tube 31 is thus simpler than that of the one of FIG. 5.

Numerous modifications of the furnace of the present invention will be obvious to those skilled in the art, and thus, it is intended by the appended claims to cover all such modifications which fall within the intended scope thereof.

I claim:

1. A furnace for heat treating workpieces comprising:
   a main heating chamber in which said workpieces are treated;
   a longitudinal supporting chamber connected in parallel to said main heating chamber;
   a connecting chamber connecting said supporting chamber to said main heating chamber;
   heating means provided around said main heating chamber for heating substantially only said main heating chamber, whereby during a heating process the temperature in said supporting chamber is lower than the temperature in said heating chamber;
   suspension cantilever means movable in said supporting chamber along the axis of said supporting chamber;
   accommodating means positioned in said main heating chamber for holding workpieces to be heat treated; and
   connecting means between said accommodating means and said cantilever means, said connecting means being movable in said connecting chamber along the axis of said main heating chamber.

2. A furnace according to claim 1, wherein said connecting chamber has a cross-sectional profile in accordance with the cross-sectional profile of said connecting means.

3. A furnace according to claim 1, wherein said furnace tube is constructed of quartz.

4. A furnace according to claim 1, wherein said furnace tube has a longitudinal axis and said heating means comprises a plurality of heating elements arranged parallel to said axis outside of said heating chamber.

5. A furace according to claim 2, wherein said furnace tube has a longitudinal axis and said heating means comprises a plurality of heating elements arranged parallel to said axis outside of said heating chamber.

6. A furnace for heat treating workpieces comprising:
   a furnace tube;
   a suspension cantilever means movable into and out of said furnace tube;
   said suspension cantilever means including an accommodating portion for holding workpieces to be heat treated and a supporting portion connected tó said accommodating portion by a plurality of stays;
   said furnace tube including a heating chamber heated by heating means for receiving said cantilever accommodating portion and heating said workpieces, a supporting chamber for receiving said cantilever supporting portion and a connecting chamber between said heating chamber and said supporting chamber; and
   said furnace tube allowing the passage of said suspension cantilever means into and out of said furnace tube for loading, heat processing and unloading of said workpieces held thereon, resulting in keeping the temperature of said supporting portion of said suspension cantilever means and said supporting chamber at a lower temperature than the temperature of said heating chamber during a heating process.

* * * * *

UNITED STATES PATENT AND TRADEMARK OFFICE
CERTIFICATE OF CORRECTION

PATENT NO. : 4,613,305
DATED : 9/23/86
INVENTOR(S) : SAKURAI

It is certified that error appears in the above-identified patent and that said Letters Patent is hereby corrected as shown below:

FRONT PAGE - OTHER PUBLICATIONS, COL. 2
Line 2, delete "Vapor" and insert --Vapour--.

Col. 1
Line 15, after "such" insert --as--.

Col. 3
Line 14, delete "cantilev,er" and insert --cantilever--;
Line 20, delete "supportng" and insert --supporting--.

Col. 4
Line 23, delete "furance" and insert --furnace--;

Col. 5
Line 1, delete "experments" and insert --experiments--;
Line 9, delete "reudces" and insert --reduces--;
Line 18, delete "maybe" and insert --may be--.

Col. 6
Line 24, delete "furace" and insert --furnace--.

Signed and Sealed this

Sixth Day of January, 1987

Attest:

DONALD J. QUIGG

Attesting Officer

Commissioner of Patents and Trademarks